US012144140B2

(12) United States Patent
Chang

(10) Patent No.: US 12,144,140 B2
(45) Date of Patent: Nov. 12, 2024

(54) SERVER, ELECTRONIC DEVICE ASSEMBLY THEREOF AND ELECTRONIC DEVICE FIXING MECHANISM THEREOF

(71) Applicant: Wistron Corporation, New Taipei (TW)

(72) Inventor: Ming-Tsun Chang, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 268 days.

(21) Appl. No.: 17/874,390

(22) Filed: Jul. 27, 2022

(65) Prior Publication Data

US 2023/0301010 A1    Sep. 21, 2023

(30) Foreign Application Priority Data

Mar. 17, 2022    (TW) .................................. 111109959

(51) Int. Cl.
*H05K 7/14*    (2006.01)
*H05K 5/02*    (2006.01)

(52) U.S. Cl.
CPC ......... *H05K 7/1488* (2013.01); *H05K 5/0221* (2013.01); *H05K 5/0286* (2013.01); *H05K 7/14* (2013.01); *H05K 7/1405* (2013.01)

(58) Field of Classification Search
None
See application file for complete search history.

(56) References Cited

U.S. PATENT DOCUMENTS

| 8,422,242 | B2  |   | 4/2013 | Lin    |            |
|-----------|-----|---|--------|--------|------------|
| 10,973,139| B1  | * | 4/2021 | Tsorng | H05K 7/1424|
| 2009/0190318 | A1 | * | 7/2009 | Komatsu | H01R 12/7017 |
|           |     |   |        |         | 439/83 |
| 2012/0148397 | A1 | * | 6/2012 | Tsai   | G06F 1/20 |
|           |     |   |        |         | 415/213.1 |
| 2021/0378123 | A1 | * | 12/2021 | Chang | G06F 1/1635 |

FOREIGN PATENT DOCUMENTS

| CN | 107387449 A  |   | 11/2017 |
|----|--------------|---|---------|
| CN | 207363932 U  | * | 5/2018  |
| TW | 201216820 A  |   | 4/2012  |
| TW | 201337111 A  |   | 9/2013  |
| TW | 201525669 A  |   | 7/2015  |
| TW | 201931698 A  |   | 8/2019  |

OTHER PUBLICATIONS

Examination report dated Jan. 9, 2023, listed in related Taiwan patent application No. 111109959.

* cited by examiner

*Primary Examiner* — James Wu
*Assistant Examiner* — Christopher L Augustin
(74) *Attorney, Agent, or Firm* — McClure, Qualey & Rodack, LLP

(57) ABSTRACT

A server includes a chassis and an electronic device assembly. The electronic device assembly includes a holder and a fixing member. The holder accommodates an electronic device and includes a limiting slot and a positioning hole. The fixing member includes a hook set. The hook set includes a first hook and a second hook. The first hook is connected to the limiting slot to be limited in a first direction. The second hook is connected to the positioning hole to be limited in a second direction. The first direction is substantially different from the second direction. The fixing member and the holder sandwich a connector connected to the electronic device.

20 Claims, 13 Drawing Sheets

SERVER, ELECTRONIC DEVICE ASSEMBLY THEREOF AND ELECTRONIC DEVICE FIXING MECHANISM THEREOF

CROSS-REFERENCE TO RELATED APPLICATION

This non-provisional application claims priority under 35 U.S.C. § 119(a) to Patent Application No. 111109959 filed in Taiwan, R.O.C. on Mar. 17, 2022, the entire contents of which are hereby incorporated by reference.

BACKGROUND

Technical Field

The present invention relates to a server, an electronic device assembly thereof and an electronic device fixing mechanism thereof.

Related Art

Computers or servers generate heat during running. Therefore, to make the computers or the servers run smoothly, fan modules are mounted on casings of the computers or the servers to exhaust hot air.

Currently, the fan module often requires a plurality of parts to be assembled, resulting in relatively high production costs. Moreover, a process of assembling the plurality of parts is relatively cumbersome and inconvenient. In addition, because the plurality of parts are required, matching positions between the plurality of parts are prone to misalignment, it is difficult to assemble, and that the fan module has an unstable overall structure and is thus loosened and fallen off is even easily caused.

SUMMARY

In view of this, according to some embodiments, a server comprises a chassis and an electronic device assembly. The electronic device assembly comprises a holder and a fixing member. The holder is connected to the chassis and comprises a limiting slot and a positioning hole. The fixing member comprises a hook set. The hook set comprises a first hook and a second hook. The first hook is connected to the limiting slot to be limited in a first direction. The second hook is connected to the positioning hole to be limited in a second direction. The first direction is substantially different from the second direction.

Moreover, according to some embodiments, an electronic device assembly comprises an electronic device, a connector, a holder, and a fixing member. The connector is connected to the electronic device. The holder accommodates the electronic device and comprises a limiting slot and a positioning hole. The fixing member comprises a hook set. The hook set comprises a first hook and a second hook. The first hook is connected to the limiting slot to be limited in a first direction. The second hook is connected to the positioning hole to be limited in a second direction. The first direction is substantially different from the second direction. The connector is located between the fixing member and the holder.

In addition, according to some embodiments, an electronic device fixing mechanism comprises a holder and a fixing member. The holder comprises a limiting slot and a positioning hole. The fixing member comprises a hook set. The hook set comprises a first hook and a second hook. The first hook is connected to the limiting slot to be limited in a first direction. The second hook is connected to the positioning hole to be limited in a second direction. The first direction is substantially different from the second direction.

In summary, in some embodiments, the server, the electronic device assembly thereof and the electronic device fixing mechanism thereof may be firmly hooked to the holder through a hook set of the fixing member, to achieve the convenience of assembling the electronic device, and costs of other fixing parts can be saved, which is cost-effective.

Detailed features and advantages of the present invention are described in detail in the following implementations, and the content of the implementations is sufficient for a person skilled in the art to understand and implement the technical content of the present invention. A person skilled in the art can easily understand the objectives and advantages related to the embodiments of the present invention according to the contents disclosed in this specification, the claims, and the drawings.

DETAILED DESCRIPTION

The following drawings are supplemented to describe embodiments of the present invention more clearly.

Figure 1:
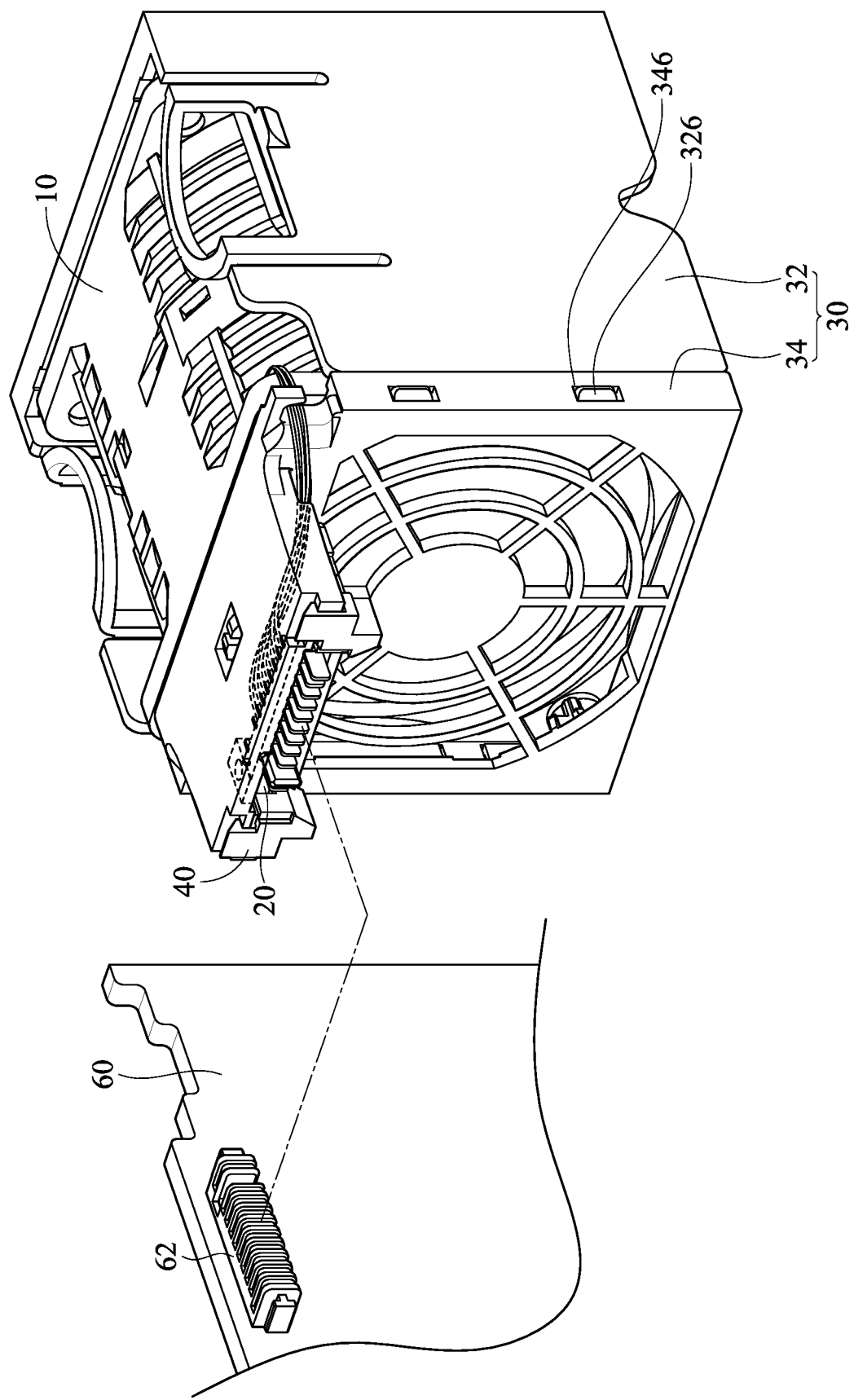
FIG. 1 is a three-dimensional diagram of a server in some embodiments.
Figure 2:
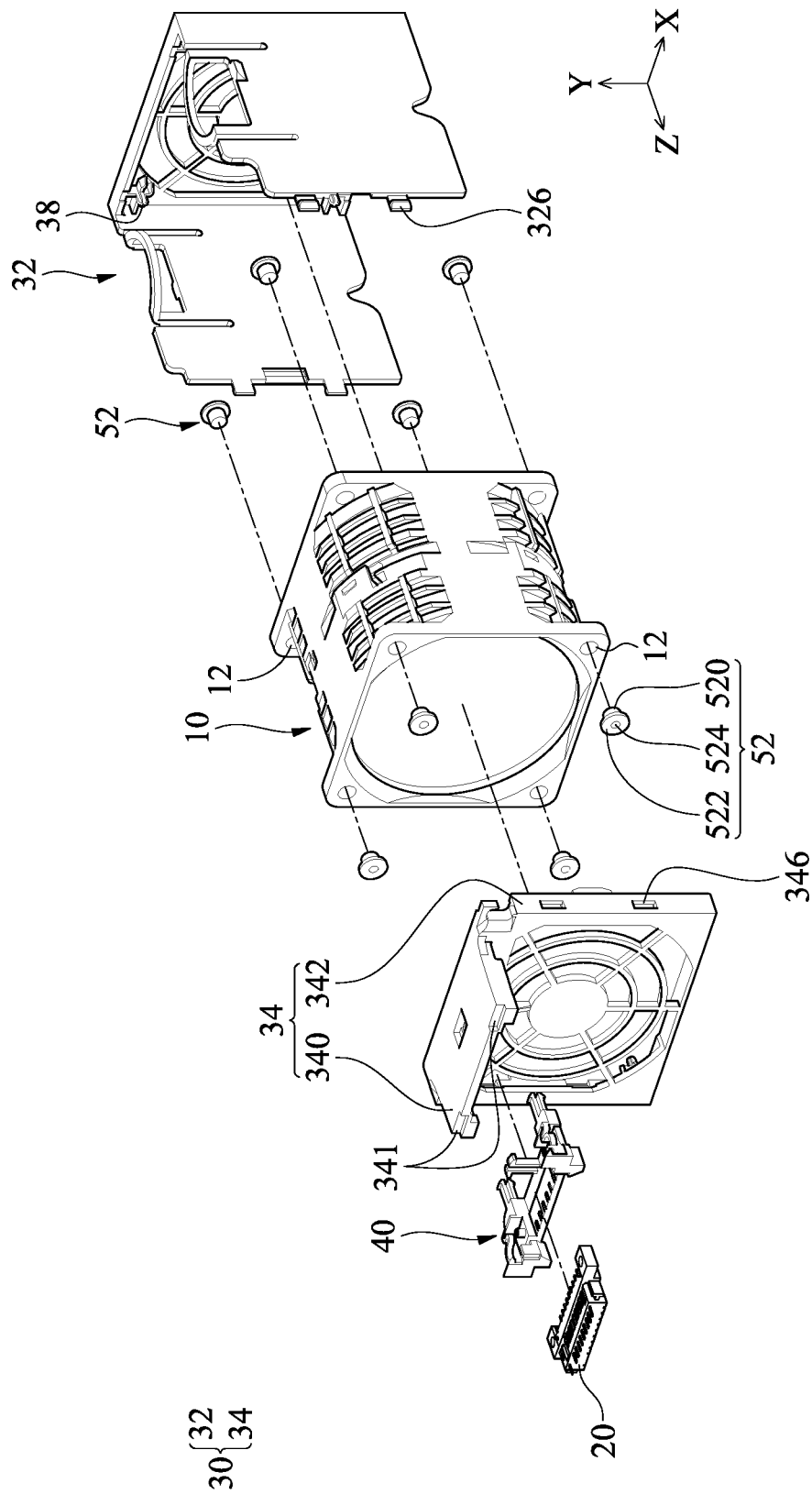
FIG. 2 is a three-dimensional exploded view of an electronic device assembly in some embodiments.
Figure 3:
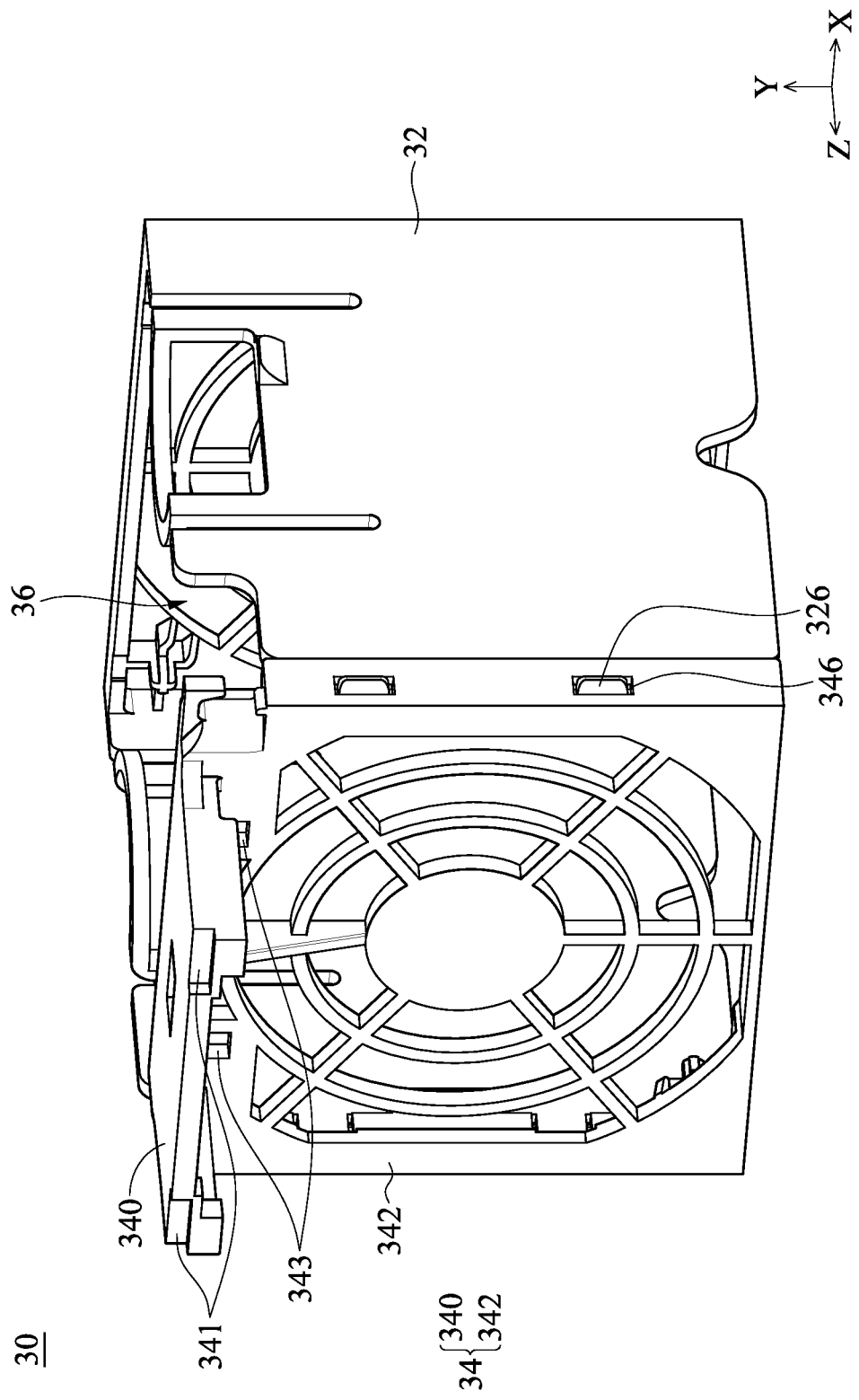
FIG. 3 is a three-dimensional diagram of a holder in some embodiments.

Referring to FIG. 1, FIG. 2, and FIG. 3, FIG. 1 is a three-dimensional diagram of a server in some embodiments. FIG. 2 is a three-dimensional exploded view of an electronic device assembly in some embodiments (where FIG. 2 omits a conducting wire between a connector 20 and an electronic device 10). FIG. 3 is a three-dimensional diagram of a holder in some embodiments.

A server comprises a chassis 60 and an electronic device assembly. The electronic device assembly comprises a holder 30 and a fixing member 40. The holder 30 is connected to the chassis 60 and comprises a limiting slot 341 and a positioning hole 343. The fixing member 40 comprises a hook set. The hook set comprises a first hook 44 and a second hook 46. The first hook 44 is connected to the limiting slot 341 to be limited in a first direction. The second hook 46 is connected to the positioning hole 343 to be limited in a second direction. The first direction is substantially different from the second direction.

In some embodiments, the holder 30 comprises a rear seat 32 and a front plate 34. The front plate 34 is connected to the rear seat 32. The front plate 34 comprises the limiting slot 341 and the positioning hole 343. The rear seat 32 and the front plate 34 may be one-piece or two-piece component (described in detail later).

The chassis 60 is used for accommodating elements such as a main board of the server (not shown in the figure) and a transformer (not shown in the figure). In some embodiments, the electronic device assembly further comprises an electronic device 10 and a connector 20. The chassis 60 comprises a butting member 62. The front plate 34 is connected to the rear seat 32 to form an accommodating portion 36. The electronic device 10 is accommodated in the accommodating portion 36. The electronic device 10 is electrically connected to the connector 20 (it can be seen in FIG. 1 that the two are electrically connected by a conducting wire). The connector 20 is electrically connected to the butting member 62. In this way, the server may communicate or supply power with the electronic device 10 through the connector 20.

According to some embodiments, the electronic device 10 may be any electronic device connected to a computer host or a server. The electronic device 10 is, for example, but not limited to, a heat dissipation element. The heat dissipation element may be, but not limited to, a fan or a hot-pluggable fan. The drawings use a fan as the electronic device 10 for example only, but not to limit the scope of the electronic device 10.

Referring to FIG. 1, the electronic device assembly comprises an electronic device 10, a connector 20, a holder 30, and a fixing member 40. The connector 20 is connected to the electronic device 10. In this embodiment, the connector 20 is electrically connected to the electronic device 10. The electronic device assembly is detachably disposed in the chassis 60 of the server. For example, the electronic device 10 is detachably connected to a butting member 62 of the chassis 60 through the connector 20, to facilitate the mounting or dismounting for maintenance of the electronic device assembly.

Figure 5:
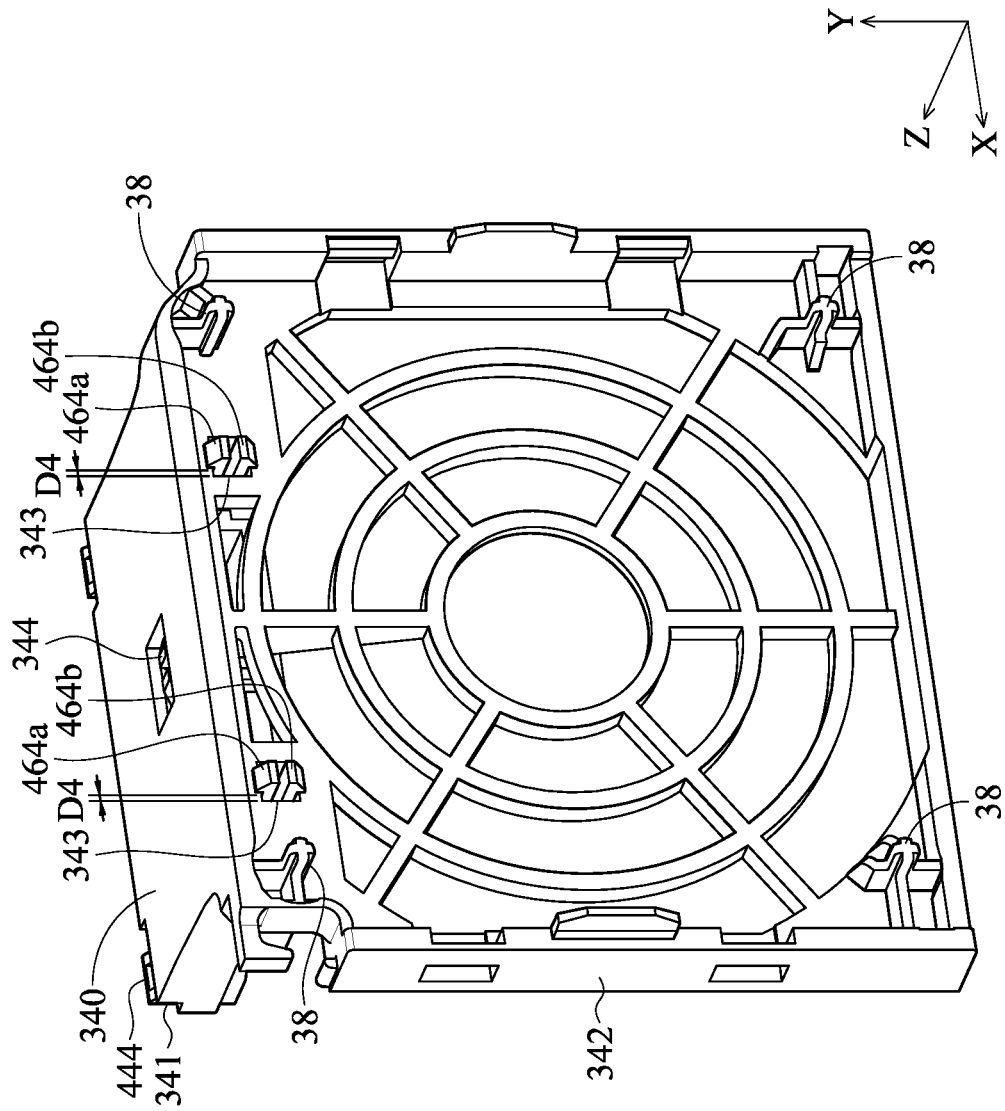
FIG. 5 is a side view of a part of a connection structure between a fixing member and a holder in some embodiments.

Referring to FIG. 2 and FIG. 3, the holder 30 comprises the rear seat 32 and the front plate 34. The front plate 34 is connected to the rear seat 32 to form the accommodating portion 36 (shown in FIG. 3). The front plate 34 and the rear seat 32 may be a casing that is integrally formed or may be detachably connected to each other through a fixing structure. In an embodiment, as shown in FIG. 3 and FIG. 5, the front plate 34 has a groove 346. The rear seat 32 has a lug 326. The front plate 34 and the rear seat 32 are detachably connected through the groove 346 and the lug 326. Disposition positions of the groove 346 and the lug 326 are interchangeable, provided that a detachable connection between the front plate 34 and the rear seat 32 is formed. The electronic device 10 is accommodated in the accommodating portion 36. The front plate 34 comprises a connection portion 340 and a body portion 342. The connection portion 340 is connected to the body portion 342. The connection portion 340 and the body portion 342 may be integrally formed or connected through a fixing structure. A connection angle between the connection portion 340 and the body portion 342 (an angle viewed in an X direction in FIG. 3) may be, but not limited to, substantially perpendicular or between 60 degrees and 120 degrees. The foregoing fixing structure may be a clamping structure, a buckle structure, a hook structure, a tight fitting structure, or any other structure.

The connection portion 340 comprises the limiting slot 341. The body portion 342 comprises the positioning hole 343.

Figure 4:
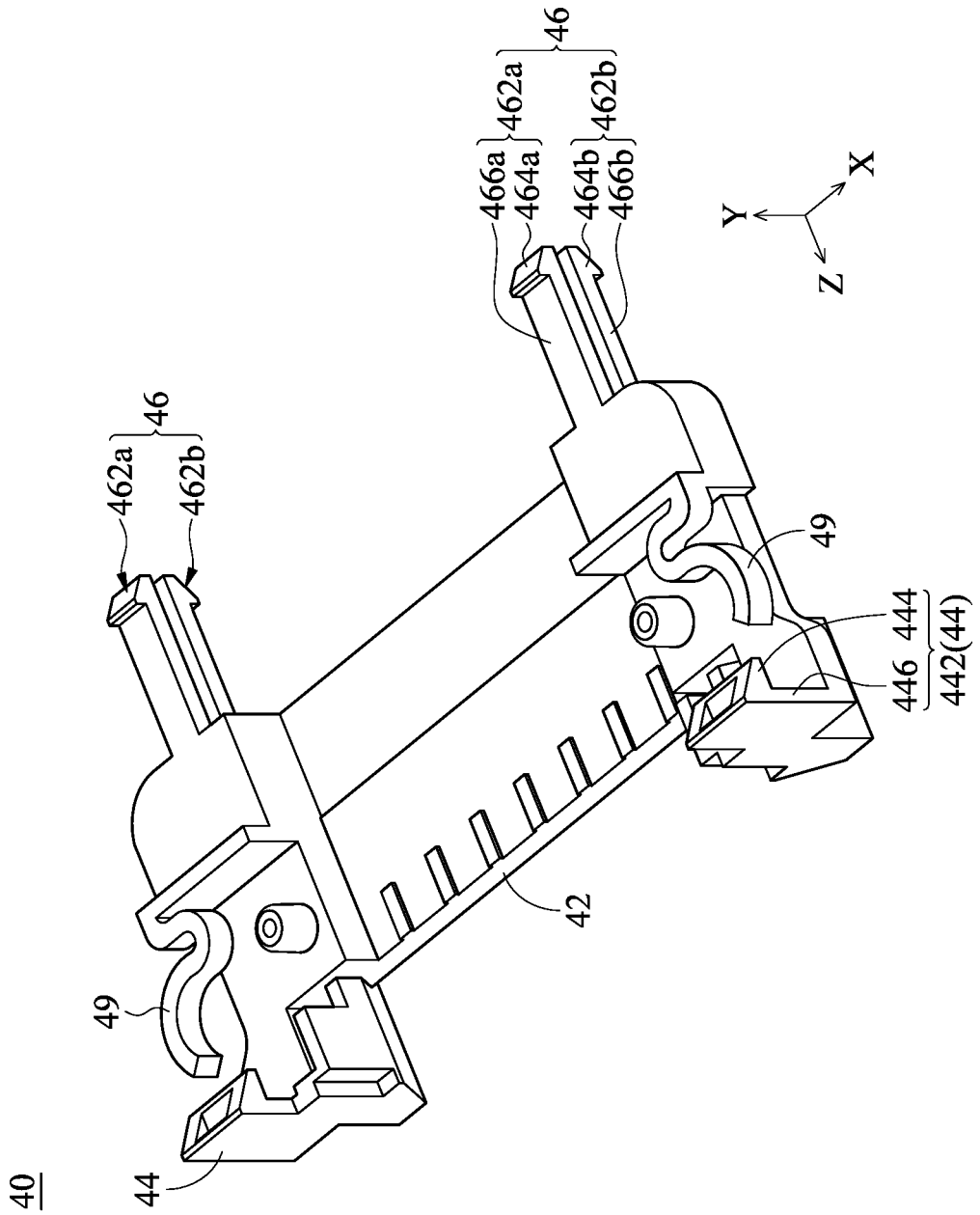
FIG. 4 is a three-dimensional diagram (1) of a fixing member in some embodiments.

Referring to FIG. 4 and FIG. 5, FIG. 4 is a three-dimensional diagram (1) of a fixing member in some embodiments. FIG. 5 is a side view of a part of a connection structure between a fixing member and a holder in some embodiments.

The fixing member 40 comprises a hook set. FIG. 4 is used as an example. The fixing member 40 comprises a hook sets. The hook set comprises a first hook 44 and a second hook 46. The first hook 44 is connected to the limiting slot 341 to be limited in a first direction. The second hook 46 is connected to the positioning hole 343 to be limited in a second direction. The first direction is substantially different from the second direction. The fixing member 40 is restrained on the holder 30 by the first hook 44 and the second hook 46. In addition, the connector 20 is located between the fixing member 40 and the holder 30. In this embodiment, the first hook 44 is connected to the limiting slot 341 in a hook manner. Similarly, the second hook 46 is also connected to the positioning hole 343 in a hook manner. The hook between two elements may be a connection relationship between the two elements with a displaceable margin in a specific axial direction or a connection relationship (such as buckle) between the two elements without a displaceable margin in six axial directions (+X, −X, +Y, −Y, +Z, and −Z axial directions); and the displaceable margin in the specific axial direction may be a displaceable margin in one to five axial directions. In the embodiments shown on FIG. 4, the hook set comprises two the first hooks 44 and two the second hooks 46. However, the number of the first hooks 44 may be one, three or more while the number of the second hooks 46 may be one, three or more. In the embodiment of single first hook and single second hook, the single first hook may be located at the middle of the fixing member 40 (i.e. middle of the two first hooks 44 shown on FIG. 4), and the single second hook may be located at the middle of the fixing member 40 (i.e. middle of the two second hooks 46 shown on FIG. 4). Alternatively, in the embodiment of the single first hook and single second hook, the single first hook may be located at a side of the fixing member 40 while the single second hook may be located at a side of the fixing member 40. In other words, only one of the two first hooks 44 and one of the two second hooks on FIG. 4 are remained in the embodiment of the single first hook and single second hook.

In some embodiments, with reference to FIG. 5, the first hook 44 is hooked to the limiting slot 341, so that the first hook 44 of the fixing member 40 is limited in a first direction (that is, a −Y direction in FIG. 5). In this case, the fixing member 40 is hooked to the holder 30 and cannot be moved toward the −Y direction, and the connector 20 is fixed at a specific position in a Y axis by the fixing member 40 and the holder 30. Moreover, each second hook 46 is inserted into in a −Z direction and hooked to a corresponding positioning hole 343 of the front plate 34, so that the second hook 46 is limited in a second direction (that is, a +Z direction in FIG. 5). That is, the second hook 46 is hooked to the positioning hole 343 to limit movement of the fixing member 40 in the +Z direction (that is, the second direction). The first direction is substantially different from the second direction.

In some embodiments, the fixing member 40 further comprises a base plate 42 (see FIG. 4). The first hook 44 and the second hook 46 are separately connected to the base plate 42. Each hook 44 or 46 comprises at least one of hook element 442, 462a, and 462b. For example, in the embodiment of FIG. 4, the first hook 44 comprises one hook element 442, and the second hook 46 comprises two hook elements 462a and 462b. Each of the hook elements 442, 462a, and 462b comprises a hook portion 444, 464a, or 464b and a hook post 446, 466a, or 466b. For example, in the embodiment of FIG. 4, the hook element 442 of the first hook 44 comprises the hook portion 444 and the hook post 446. Two hook elements 462a and 462b of the second hook 46 comprise the hook portions 464a and 464b and the hook posts 466a and 466b, respectively. The hook posts 466a and 466b of each of the hook elements 462a and 462b are separate and substantially parallel to each other. Each hook post 446, 466a, or 466b is connected to the base plate 42 and the corresponding hook portion 444, 464a, or 464b. In this embodiment, the connection of the hook post 446, 466a, or 466b to the base plate 42 and the corresponding hook portion 444, 464a, or 464b may be in an integrally formed manner or through a fixing structure.

Referring to FIG. 4, the fixing member 40 comprises at least one first hook 44 and two second hooks 46. In an embodiment, the fixing member 40 comprises two first hooks 44 and two second hooks 46. Each first hook 44 comprises at least one hook element 442. Each second hook 46 comprises at least one of hook elements 462a and 462b. Each of the hook elements 442, 462a, and 462b comprises a hook portion 444, 464a, or 464b and a hook post 446, 466a, or 466b. Each hook post 446, 466a, or 466b is connected to the base plate 42 and the corresponding hook portion 444, 464a, or 464b.

Figure 6:
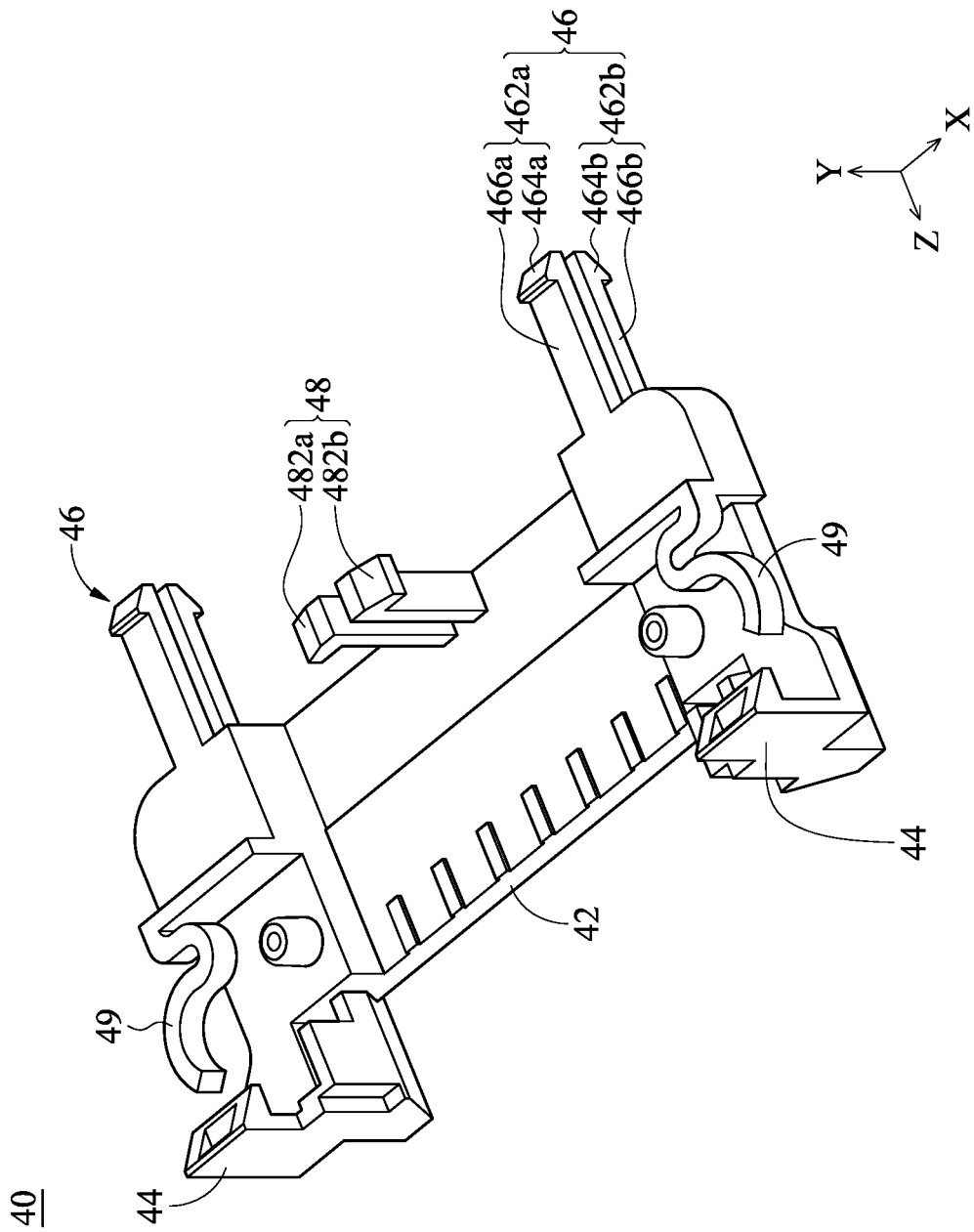
FIG. 6 is a three-dimensional diagram (2) of a fixing member in a second embodiment.

Referring to FIG. 6, FIG. 6 is a three-dimensional diagram (2) of a fixing member in a second embodiment. In this embodiment, the fixing member 40 comprises two first hooks 44, two second hooks 46, and a third hook 48. The third hook 48 comprises two hook elements 482a and 482b. The two hook elements 482a and 482b of the third hook 48 are substantially arranged in parallel in opposite directions.

Referring to FIG. 5, FIG. 5 is a side view of a part of a connection structure between a fixing member and a holder in some embodiments. Although the fixing member in the embodiment of FIG. 5 corresponds to the fixing member 40 of FIG. 6, a connection relationship between the fixing member 40 in FIG. 4 and the front plate 34 of the holder 30 can still be described. It can be seen from the figures that the hook portion 444 of the first hook 44 is hooked to the limiting slot 341. The hook portions 464a and 464b of the second hook 46 are hooked to the positioning hole 343. Therefore, when the fixing member 40 and the holder 30 are assembled, the hook portions 464a and 464b of the second hook 46 are inserted into the positioning holes 343 of the front plate 34, and the hook portion 444 of the first hook 44 abuts against an edge (the limiting slot 341) of the connection portion 340, to fix the fixing member 40 at a predetermined position of the holder 30.

Therefore, the electronic device assembly may be hooked to the holder 30 through the first hook 44 and the second hook 46 of the fixing member 40, to achieve the convenience of assembling the electronic device, and costs of other fixing parts can also be saved, which is cost-effective.

In addition, referring to FIG. 4 again, according to some embodiments, the second hook 46 is used as an example. Each hook may comprise two hook elements 462a and 462b, and the two hook elements 462a and 462b are substantially arranged in parallel in opposite directions. That is, the two hook elements 462a and 462b are arranged in parallel (that is, the hook posts 466a and 466b are substantially parallel to each other), and the hook portions 464a and 464b of the two hook elements 462a and 462b have opposite convex directions, but not limited thereto. In an embodiment, the base plate 42 and the second hook 46 may be in a shape of elastic T (the second hook 46 shown in FIG. 10).

Figure 7:
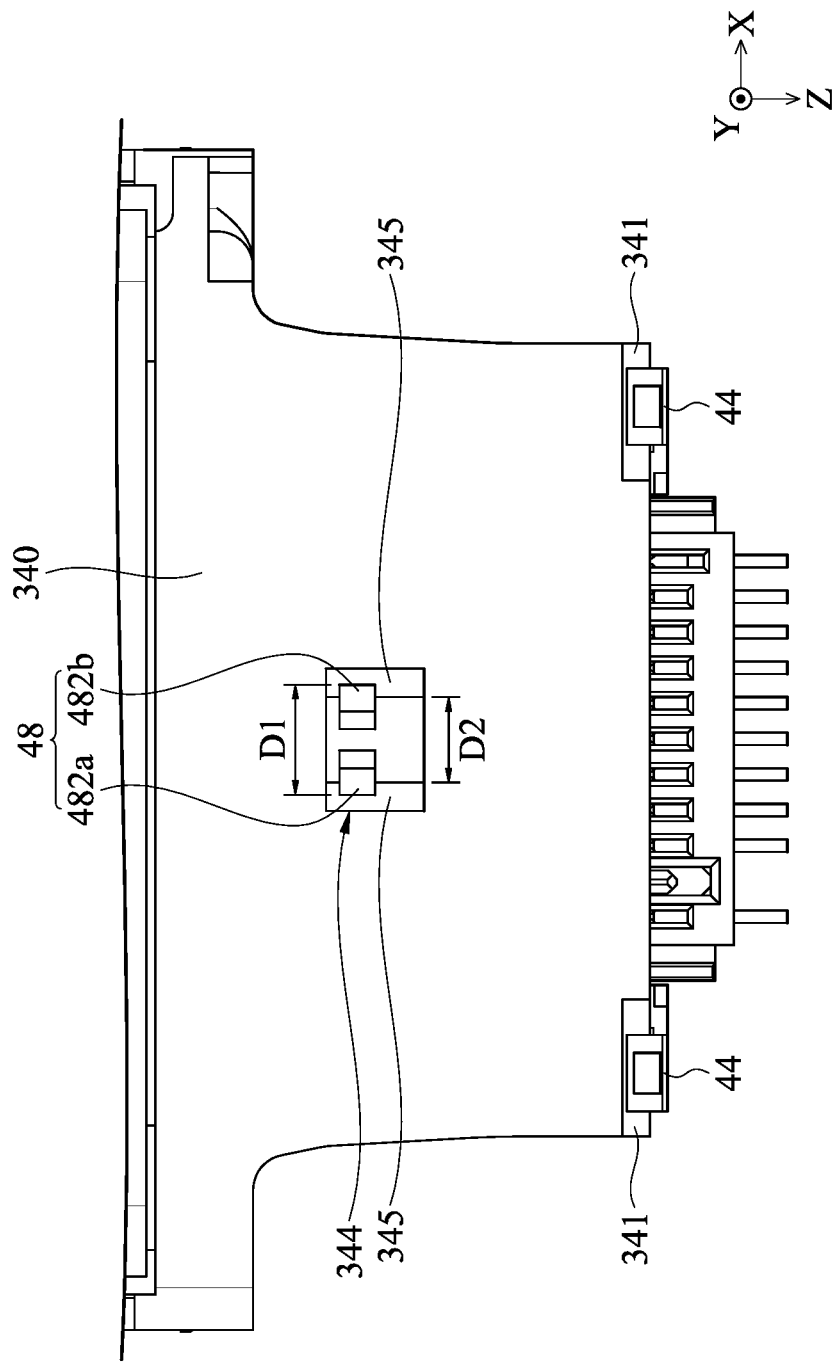
FIG. 7 is a top view of a connection structure between the fixing member and a front plate in the second embodiment.

Referring to FIG. 5, FIG. 6, and FIG. 7, FIG. 6 is a three-dimensional diagram (2) of a fixing member in a second embodiment. FIG. 7 is a top view of a connection structure between the fixing member and a front plate in the second embodiment. In this embodiment, the connection portion 340 comprises a hook hole 344, and two hook elements 482a and 482b of the third hook 48 are hooked to the hook hole 344 of the connection portion 340, to prevent the fixing member 40 from detaching from a −Y direction, an X-axis direction, and a Z-axis direction in FIG. 7. In addition, a position of the hook hole 344 of the connection portion 340 corresponds to a position between positions of two positioning holes 343 of the body portion 342. In other words, a position of the hook hole 344 of the connection portion 340 is arranged between the positioning hole 343 of the body portion 342 and a position of the limiting slot 341 of the front plate. In this way, from the top view of FIG. 7, the positioning holes 343 and the limiting slots 341 are located at four corners of a surface, and the hook hole 344 is located at an approximate center position of the four corners, thereby improving the fixing effect of the connection relationship between the fixing member 40 and the holder 30.

Referring to FIG. 5 and FIG. 7 still, the two hook elements 482a and 482b of the third hook 48 have a hook tip distance D1 (a distance when the two hook elements 482a and 482b are not squeezed inward). The hook tip distance D1 is a distance between outer convex points of the hook portions 484a and 484b of the two hook elements 482a and 482b. The hook hole 344 has an opening size D2, and the hook tip distance D1 interferes with the opening size D2. That is, the third hook 48 and the hook hole 344 have an interference relationship, and a size of the interference relationship is, for example, but not limited to, a range of 0.1 mm to 0.3 mm. However, the interference size may be adjusted according to materials of the hook elements 482a and 482b and the hook hole 344. With the design of the interference size, when the hook elements 482a and 482b of the third hook 48 enter the hook hole 344, the hook elements 482a and 482b need to be strongly pushed into the hook hole 344 (a pushing force needs to be greater than resistance caused by the foregoing interference). In this case, after the hook elements 482a and 482b of the third hook 48 enter the hook hole 344, it is difficult for the hook elements 482a and 482b of the third hook 48 to detach from the hook hole 344 in the −Y direction in FIG. 7.

Specifically, the hook tip distance D1 when the third hook 48 is not inserted into the hook hole 344 yet and the hook tip distance D1 when the third hook 48 has been hooked to the hook hole 344 are both greater than the opening size D2 of the hook hole 344. To insert the third hook 48 into the hook hole 344, when the two hook elements 482a and 482b of the third hook 48 pass through the hook hole 344, because the two hook elements 482a and 482b are squeezed due to a limitation of the opening size D2 of the hook hole 344 (and are squeezed due to guidance of a slope of the hook elements 482a and 482b (positions marked by 482a and 482b)), the hook tip distance D1 becomes a squeezed hook tip distance D1' (not shown in the figure). When the squeezed hook tip distance D1' is less than or equal to the opening size D2, the two hook elements 482a and 482b can pass through the hook hole 344, and the hook portions 484a and 484b are hooked to the hook hole 344. In this way, the third hook 48 may stably hook the fixing member 40 to the holder 30, which is difficult to loosen and fall off. In addition, to make the two hook elements 482a and 482b capable of being squeezed to enter the hook hole 344, the distance between the two hook elements 482a and 482b needs to be greater than or equal to the interference size.

In some embodiments, referring to FIG. 7, two hook portions 444 of the two first hooks 44 are correspondingly hooked to two limiting slots 341, and an inner distance of the two hook portions 444 is farther than an inner distance (where the inner distance refers to a shortest distance) of the two limiting slots 341. Therefore, when the hook portion 444 of the first hook 44 is hooked to the limiting slot 341, the fixing member 40 has a displaceable margin in the X-axis direction of FIG. 7. That is, in the X-axis, the fixing member 40 is displaceable relative to the connection portion 340 (that is, relative to the holder 30) within a first predetermined distance range.

Similarly, referring to FIG. 5, when the two hook portions 464a and 464b of the second hook 46 are located in the corresponding positioning hole 343, and also have a displaceable margin in the X-axis, the fixing member 40 is displaceable relative to the connection portion 340 (that is, relative to the holder 30) within a second predetermined distance (for example, a gap D4 shown in FIG. 5) in the X-axis. When the electronic device assembly needs to be mounted on the chassis 60 of the server, the first predetermined distance and the second predetermined distance may offset a process error and a tolerance between the butting member 62 of the chassis 60 and the electronic device assembly. Therefore, the connector 20 is more easily connected to the butting member 62 (as shown in FIG. 1), to achieve a better convenient mounting effect.

Figure 8:
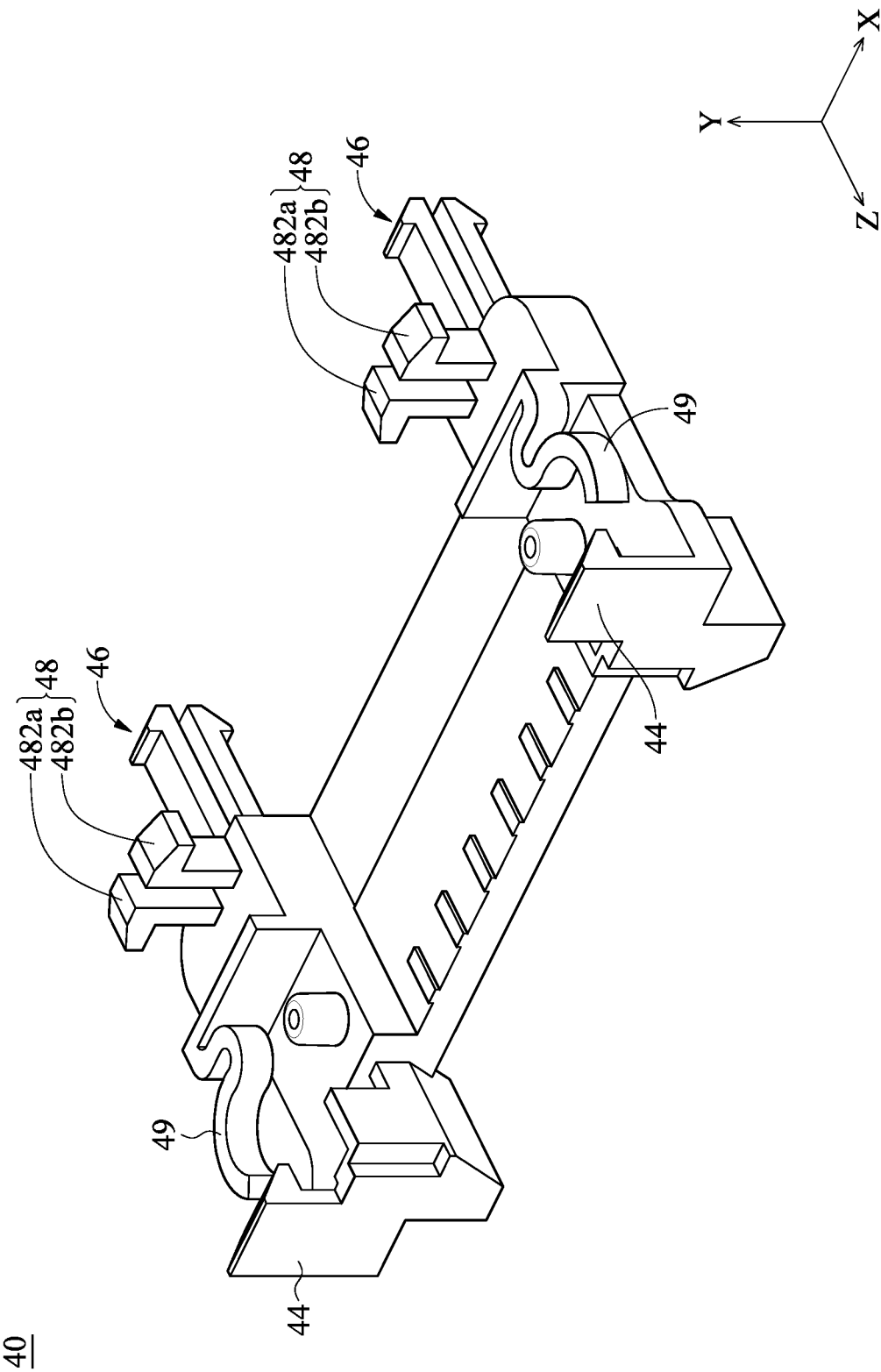
FIG. 8 is a three-dimensional diagram (3) of a fixing member in a third embodiment.
Figure 9:
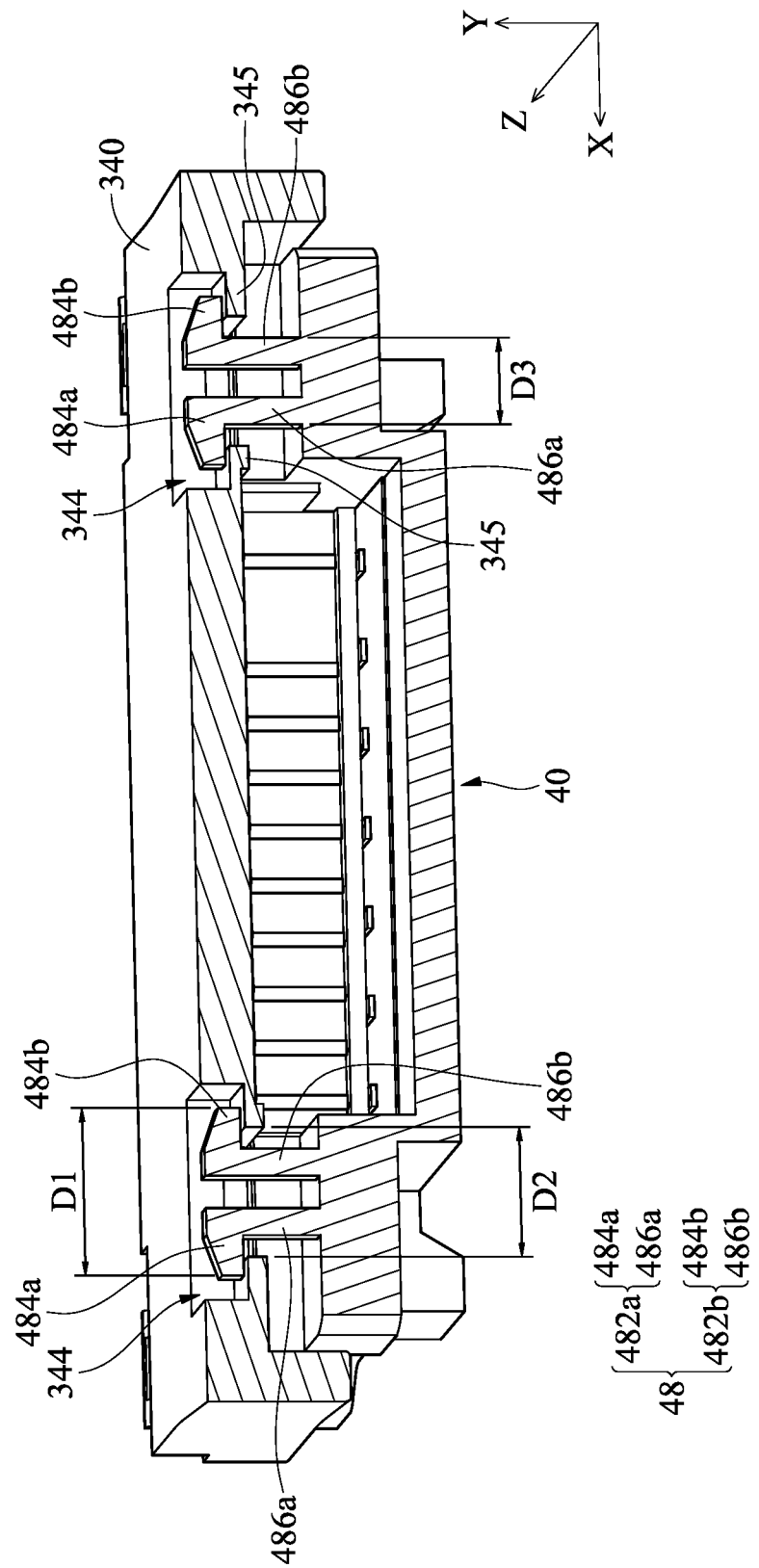
FIG. 9 is a partial cross-sectional view of a connection structure between the fixing member and a holder according to the third embodiment.

Referring to FIG. 8 and FIG. 9, FIG. 8 is a three-dimensional diagram (3) of a fixing member in a third embodiment. FIG. 9 is a partial cross-sectional view of a connection structure between the fixing member and a holder according to the third embodiment. In the embodiment of FIG. 8, the fixing member 40 comprises two third hooks 48. Each third hook 48 comprises two hook elements 482a and 482b. The two hook elements 482a and 482b of the third hook 48 are substantially arranged in parallel in opposite directions. The connection portion 340 comprises two hook holes 344, and the two hook holes 344 are located on two sides of the connection portion 340. Each third hook 48 is hooked to the corresponding hook hole 344 respectively. The two hook elements 482a and 482b of each third hook 48 have a hook tip distance D1, and the hook tip distance D1 interferes with the opening size D2 of the hook hole 344 (as shown in FIG. 9). There is a gap between two hook posts 486a of the two hook elements 482a and 482b of each third hook 48, and the gap is greater than or equal to an interference size between the hook tip distance D1 and the opening size D2. In this way, the third hook 48 can enter the hook hole 344, so that the two hook elements 482a and 482b of the third hook 48 are separately hooked to the hook hole 344.

The two hook posts 486a and 486b of the two hook elements 482a and 482b of each third hook 48 have an outer distance D3, and the outer distance D3 is less than the opening size D2. That is, when the third hook 48 is hooked to the hook hole 344, there is a margin between the two hook posts 486a and 486b and the hook hole 344 (that is, in the X-axis of FIG. 9, a difference between the outer distance D3 and the opening size D2), to absorb a tolerance value generated during mold manufacturing, and provide space to facilitate an assembly operation of the electronic device assembly connected to the butting member 62. In this embodiment, the design that the outer distance D3 of the hook posts 486a and 486b of the third hook 48 is less than the opening size D2 is also applicable to the second embodiment of FIG. 6 and FIG. 7.

According to some embodiments, referring to FIG. 9, each of two sides of the hook hole 344 of the connection portion 340 has a hooking step 345, and the two hook portions 484a and 484b of the third hook 48 are hooked to the hooking steps 345, respectively. That is, an inner distance of the hooking step 345 is the opening size D2, that is, an interference structure between the hook hole 344 and the hook tip distance D1 of the third hook 48 is constituted. A Y-axis height of the hooking step 345 is lower than a surface of the connection portion 340 (that is, the hooking step 345 has a segment gap relative to an upper surface of the front plate 34). In some embodiments, a height of the segment gap may be greater than or equal to a height of the hook portions 484a and 484b (that is, a distance in the Y direction in FIG. 9). In this case, after the two hook portions 484a and 484b of the third hook 48 are inserted into the hook hole 344, the hook portions 484a and 484b do not protrude from the upper surface of the front plate 34.

Referring to FIG. 5 again, according to some embodiments, the body portion 342 of the front plate 34 comprises two positioning holes 343, and the two positioning holes 343 are located on two sides of the front plate 34. In this embodiment, the two positioning holes 343 may be located on two sides of the body portion 342. That is, the two positioning holes 343 on the body portion 342 have a same height in the Y-axis but different positions in the X-axis. The fixing member 40 comprises two second hooks 46, the two second hooks 46 are hooked to the two positioning holes 343 respectively. Each of the two second hooks 46 has two hook elements 462a and 462b, please referred to FIG. 4 as well. As discussed above, each hook element 462a or 462b has two hook posts 466a and 466b and two hook portions 464a and 464b. Hooking directions of the two hook portions 464a and 464b of each of the two second hooks 46 are opposite. Based on this, the two second hooks 46 are hooked to the positioning holes 343, so that the fixing member 40 can be stably fixed on the holder 30 in a +Z axis direction.

Figure 10:
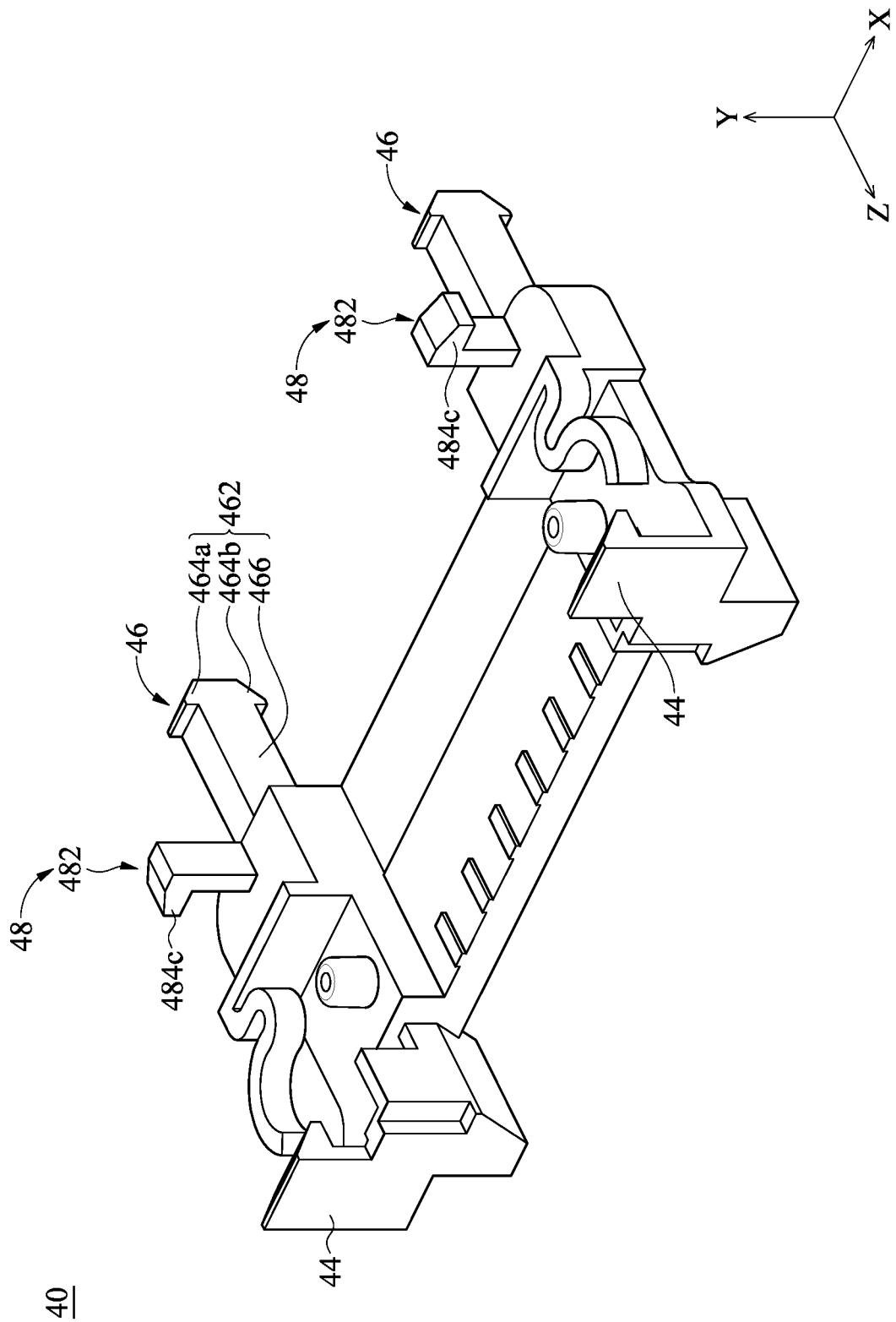
FIG. 10 is a three-dimensional diagram (4) of a fixing member in a fourth embodiment.

In addition, referring to FIG. 10, FIG. 10 is a three-dimensional diagram (4) of a fixing member in a fourth embodiment. In some embodiments, the fixing member 40 comprises two third hooks 48. Each third hook 48 comprises a hook element 482 and is correspondingly hooked to a hook hole 344 of a connection portion 340. Hooking directions of hook portions 484c of the hook element 482 of the two third hooks 48 are opposite. In some embodiments, please referring to FIG. 10, the fixing member 40 comprises two second hooks 46. Each second hook 46 comprises a hook element 462. Each of the hook elements 462 comprises two hook portions 464a, 464b and a hook post 466. The hooking directions of the hook portions 464a, 464b of each of the hook elements 462 are opposite.

Figure 11:
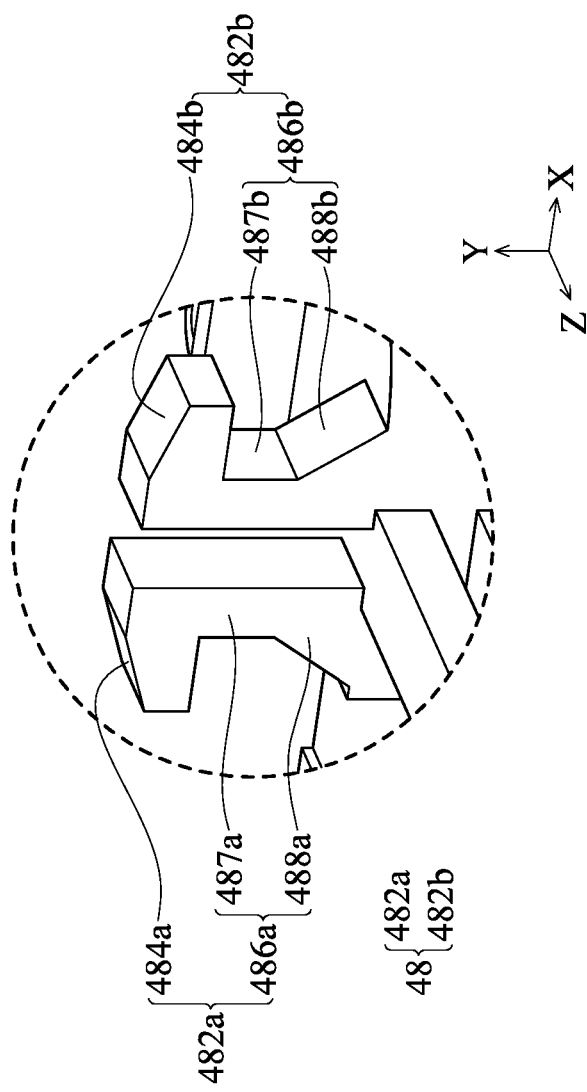
FIG. 11 is a side view of a hook in a fifth embodiment.

In addition, referring to FIG. 11, FIG. 11 is a side view of a hook in a fifth embodiment. According to some embodiments, the third hook 48 is used as an example. Each of hook elements 482a and 482b of the third hook 48 comprises a hook post 486a or 486b, and each hook post 486a or 486b comprises a base portion 488a or 488b and a neck portion 487a or 487b connected to each other. Each base portion 488a or 488b is connected to the base plate 42. Each neck portion 487a or 487b is connected to the corresponding hook portion 484a or 484b. A cross-sectional area of each base portion 488a or 488b is greater than a cross-sectional area of each neck portion 487a or 487b. The cross-sectional area is an area perpendicular to the length direction (Y-axis) of the hook post 486a or 486b, and parallel to XZ-plane. That is, from a top view (that is, a viewing angle from a +Y direction to a −Y direction in FIG. 12), the cross-sectional area of each base portion 488a or 488b is greater than the cross-sectional area of each neck portion 487a or 487b. The hook posts 486a and 486b have the base portions 488a and 488b of a thick structure, so that the stability of the third hook 48 being hooked to the hook hole 344 can be strengthened, which is difficult to loosen. In this embodiment, a connection of the base portion 488a or 488b to the neck portion 487a or 487b, a connection of the base portion 488a or 488b to the base plate 42, and a connection of the neck portion 487a or 487b to the hook portion 484a or 484b may be in an integrally formed manner or through a fixing structure.

Figure 12:
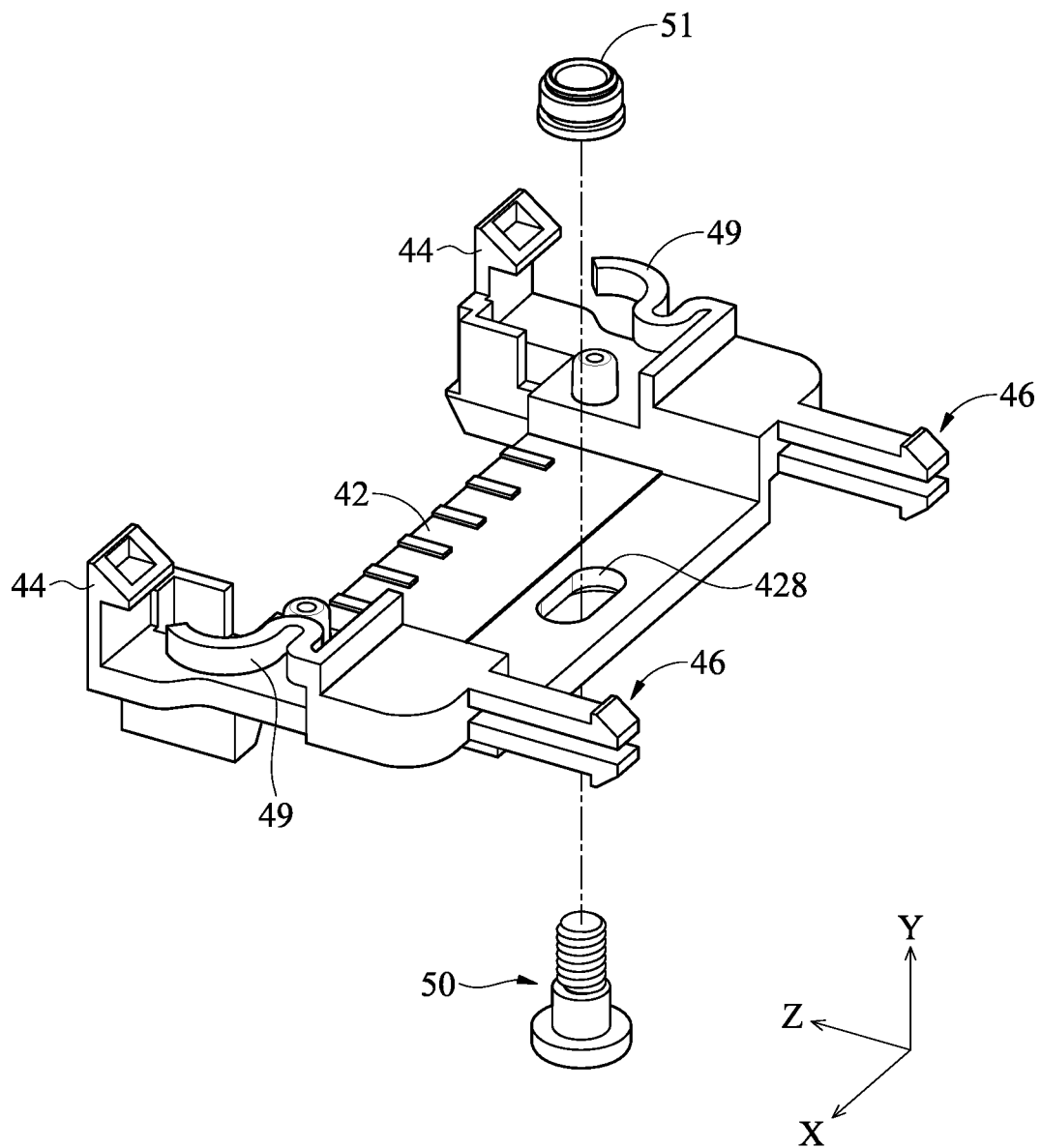
FIG. 12 is a three-dimensional exploded view (1) of a fixing member and a locking member in a sixth embodiment.

In another aspect, referring to FIG. 12, FIG. 12 is a three-dimensional exploded view (1) of a fixing member and a locking member in a sixth embodiment. According to some embodiments, the electronic device assembly further comprises a locking member 50. The locking member 50 may be, but not limited to, a screw, a nut, or a rivet.

In this embodiment, the base plate 42 has a through hole 428. The locking member 50 passes through the through hole 428 and is locked to the front plate 34 (for the front plate 34, refer to FIG. 2). Therefore, the electronic device assembly fastens the fixing member 40 to the holder 30 through the locking member 50, and then fixes the connector 20 between the fixing member 40 and the holder 30.

In some embodiments, the front plate 34 comprises a sleeve 51 corresponding to the locking member 50, used for correspondingly locking with the locking member 50. The sleeve 51 may be a part of the front plate 34 (that is, the two are one-piece); or the sleeve 51 and the front plate 34 may be two separate elements.

Figure 13:
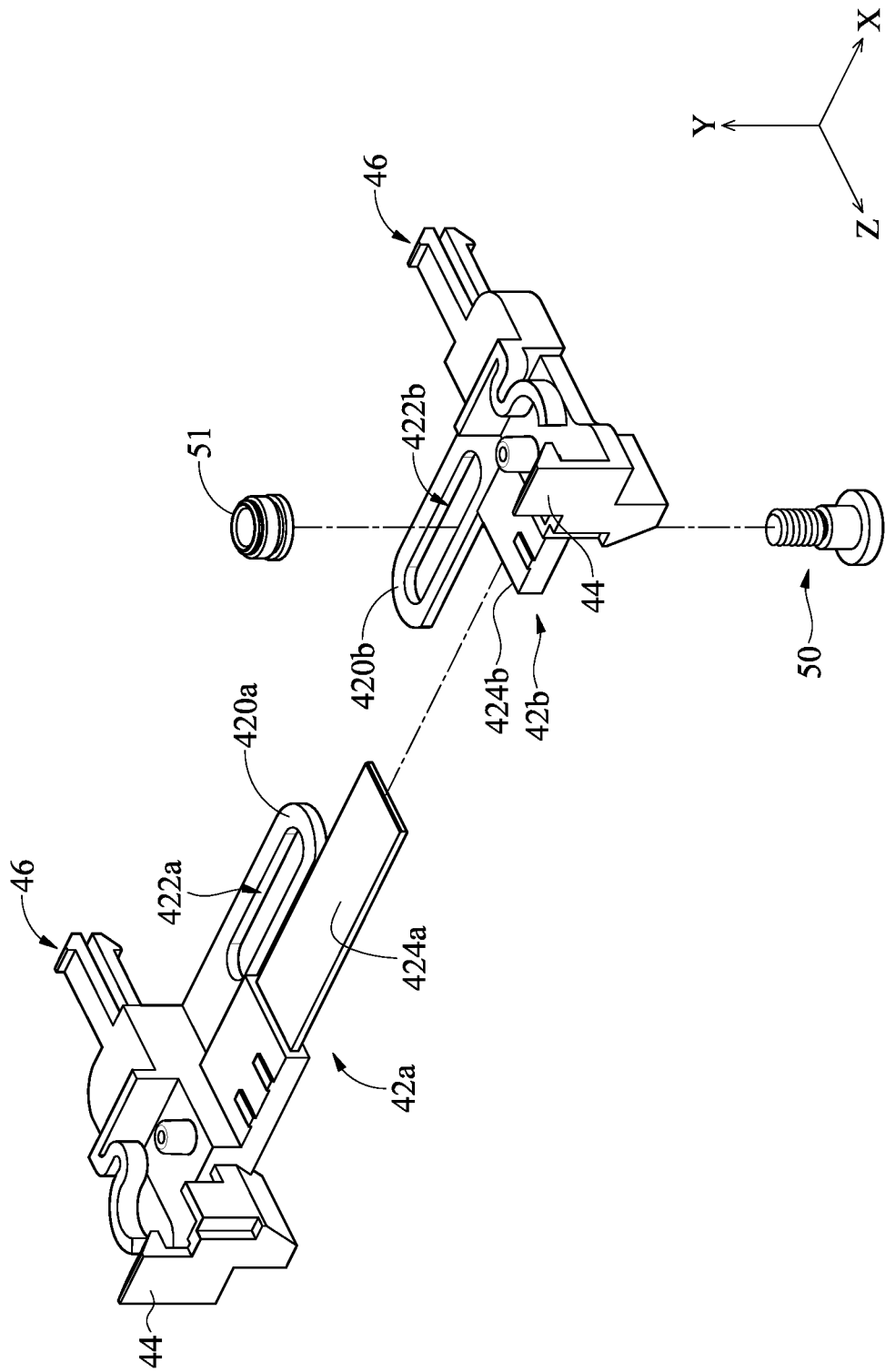
FIG. 13 is a three-dimensional exploded view (2) of a fixing member and a locking member in a seventh embodiment.

In another aspect, referring to FIG. 13, FIG. 13 is a three-dimensional exploded view (2) of a fixing member and a locking member in a seventh embodiment. According to some embodiments, the fixing member 40 comprises two base plates 42a and 42b, each of the base plates 42a and 42b comprises a mating portion 420a or 420b, and each mating portion 420a or 420b comprises a slot hole 422a or 422b. The electronic device assembly further comprises a locking member 50, and the locking member 50 passes through the two slot holes 422a and 422b and is locked to the front plate 34. A relationship between the sleeve 51 and the locking member 50 is described in the previous paragraph, and details are not described herein again.

In the embodiment of FIG. 13, the fixing member 40 is two-piece, and comprises two base plates 42a and 42b, so that the fixing member 40 can movably adjust a relative distance between the two base plates 42a and 42b. Therefore, connectors 20 of different widths are applicable. In this way, mold opening costs can be saved.

Further, in some embodiments, the mating portion 420a or 420b of each base plate 42a or 42b may further comprise a reinforcing portion 424a or 424b, and one of two reinforcing portions 424a of the two base plates 42a and 42b is correspondingly inserted into the other of the two reinforcing portions 424b of the two base plates 42a and 42b. Referring to FIG. 13, the reinforcing portion 424a on a left side of the drawing is an insert plate, and the reinforcing portion 424b on a right side of the drawing is a corresponding slot. In this way, the two reinforcing portions 424a and 424b may be inserted into each other to enhance the stability of a physical connection of the two base plates 42a and 42b.

In another aspect, referring to FIG. 2 again, according to some embodiments, the electronic device assembly further comprises a plurality of elastic convex posts 52, and the electronic device 10 has a plurality of fixing holes 12. The fixing holes 12 face the rear seat 32 or the front plate 34. The elastic convex posts 52 are respectively fixed to and protruded from the fixing holes 12.

Specifically, each elastic convex post 52 has a base 522, a convex portion 520, and a concave portion 524. The convex portion 520 may be inserted into the fixing hole 12 of the electronic device 10. The concave portion 524 is disposed on a back surface relative to the convex portion 520. Positions of the rear seat 32 and the front plate 34 corresponding to each of the fixing holes 12 are provided with positioning short posts 38 (where a positioning short post 38 of the rear seat 32 may be seen in FIG. 2, and a positioning short posts 38 of the front plate 34 may be seen in FIG. 5). Each positioning short post 38 faces a corresponding one fixing hole 12. The concave portion 524 of each elastic convex post 52 is adapted to be sleeved on a positioning short post 38. Therefore, the positioning short posts 38 on the rear seat 32 and the front plate 34 may insert the convex portions 520 of the elastic convex posts 52 into the corresponding fixing holes 12 by sleeving the concave portions 524 of the elastic convex posts 52, so that bases 522 of some of the elastic convex posts 52 are sandwiched between the electronic device 10 and the rear seat 32, and the bases 522 of some of the elastic convex posts 52 are sandwiched between the electronic device 10 and the front plate 34. In this way, the electronic device 10 may be fixed in the accommodating portion 36 formed by the rear seat 32 and the front plate 34, and the elastic convex post 52 provides a buffer effect to absorb vibration generated when the electronic device 10 runs, to maintain the overall stability of the electronic device assembly.

In another aspect, referring to FIG. 4 again, according to some embodiments, the fixing member 40 further comprises two elastic suspension arms 49, and the two elastic suspension arms 49 are disposed on two sides of the base plate 42. The elastic suspension arm 49 may be, but not limited to, S-shaped or C-shaped. Each elastic suspension arm 49 has an elastic stroke to absorb manufacturing and design tolerances of the fixing member 40, the holder 30, the connector 20, and the butting member 62 of the chassis 60. In some embodiments, the elastic stroke is an elastic stroke in the X-axis direction, and the elastic stroke corresponds to the displaceable margin in the X-axis direction of the foregoing hook set (for example, the first hook 44, the second hook 46, and the third hook 48). In some embodiments, the elastic stroke of the elastic suspension arm 49 may be in a range of 0.76 mm to 0.8 mm. Therefore, when the electronic device assembly is assembled, a relative position between the fixing member 40 and the holder 30 may be adjusted through an elastic force of the elastic suspension arm 49. In addition, after the fixing member 40 is hooked to the holder 30, the elastic suspension arm 49 is hooked to a bottom side of the connection portion 340 of the holder 30, to enhance the stability of a connection structure between the fixing member 40 and the holder 30. In addition, referring to FIG. 1, when the connector 20 of the electronic device assembly is inserted into the butting member 62 of the chassis 60 of the server, the elastic stroke of the elastic suspension arm 49 can provide elasticity, so that the connector 20 may be smoothly inserted into the butting member 62. In this way, assembly obstacles caused by the tolerances during part manufacturing can be resolved. In addition, after the connector 20 is inserted into the butting member 62, the elastic suspension arm 49 has a maintenance force to maintain a connection status between the electronic device assembly and the connector 20.

In another aspect, referring to FIG. 3 again, according to some embodiments, FIG. 3 shows an electronic device fixing mechanism, and the electronic device fixing mechanism comprises a holder 30 and a fixing member 40. The electronic device fixing mechanism is adapted to fix the electronic device 10 (for example, the fan), to form the foregoing electronic device assembly, and cause that the electronic device 10 is detachably connected to the butting member 62 of the chassis 60.

In some embodiments, referring to FIG. 1, the electronic device 10 may be, but not limited to, a fan, and the electronic device 10 is electrically connected to the connector 20. The electronic device fixing mechanism may fix a relative position between the electronic device 10 and the connector 20, so that the electronic device 10 is connected to the butting member 62 of the chassis 60 of the server through the connector 20, to facilitate mounting or maintenance of the electronic device 10. For detailed structures of the holder 30 and the fixing member 40 of the electronic device fixing mechanism, refer to the foregoing description and corresponding drawings about the electronic device assembly, and details are not described again.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A server, comprising:
a chassis; and
an electronic device assembly, comprising:
a holder, connected to the chassis and comprising a limiting slot and a positioning hole; and
a fixing member, comprising a hook set, a base plate, and an elastic suspension arm,
wherein the elastic suspension arm is disposed on the base plate and adapted to hook to a side of the holder; the hook set comprises a first hook and a second hook; and
wherein the first hook is connected to the limiting slot to be limited in a first direction, the second hook is connected to the positioning hole to be limited in a second direction, and the first direction is different from the second direction.

2. The server according to claim 1, wherein
the chassis comprises a butting member, the electronic device assembly further comprises an electronic device and a connector, the electronic device is electrically connected to the connector, and the connector is electrically connected to the butting member; and
the holder comprises a rear seat and a front plate, the rear seat is connected to the front plate to form an accommodating portion, the accommodating portion accommodates the electronic device, and the front plate comprises the limiting slot and the positioning hole.

3. The server according to claim 2, wherein
the front plate comprises two limiting slots and two positioning holes, the hook set further comprising another first hook and another second hook, the two first hook are hooked to the two limiting slots respectively, and the two second hooks are hooked to the two positioning holes, respectively; and
the hook set further comprises a third hook, the front plate further comprises a hook hole, the third hook comprises two hook elements, the two hook elements of the third hook are arranged in parallel in opposite directions and hooked to the hook hole, the two hook elements of the third hook have a hook tip distance, the hook hole has an opening size, the hook tip distance interferes with the opening size, each of the two hook elements of the third hook comprises a hook post, two hook posts of the two hook elements of the third hook have an outer distance, and the outer distance is less than the opening size.

4. An electronic device assembly, comprising:
an electronic device;
a connector, connected to the electronic device;
a holder, accommodating the electronic device and comprising a limiting slot and a positioning hole; and
a fixing member, comprising a hook set, a base plate, and an elastic suspension arm,
wherein the elastic suspension arm is disposed on the base plate and adapted to hook to a side of the holder; the hook set comprises a first hook and a second hook; and
wherein the first hook is connected to the limiting slot to be limited in a first direction, the second hook is connected to the positioning hole to be limited in a second direction, and the first direction is different from the second direction; and the connector is located between the fixing member and the holder.

5. The electronic device assembly according to claim 4, wherein
the holder comprises a rear seat and a front plate, the front plate comprises the limiting slot and the portioning hole; and the rear seat is connected to the front plate to form an accommodating portion, and the accommodating portion accommodates the electronic device; and
the fixing member further comprises a base plate, each hook comprises a hook element, each hook element comprises a hook portion and a hook post, each hook post is connected to the base plate and the hook portion; and the hook portion of the first hook is hooked to the limiting slot, and the hook portion of the second hook is hooked to the positioning hole.

6. The electronic device assembly according to claim 5, wherein the hook set further comprises a third hook, the front plate further comprises a hook hole, the third hook comprises two hook elements, the two hook elements of the third hook are arranged in parallel and opposite directions, the two hook elements of the third hook have a hook tip distance, the third hook is hooked to the hook hole, the hook hole has an opening size, the hook tip distance interferes with the opening size, the two hook elements of the third hook comprise two hook posts, the two hook posts of the two hook elements of the third hook have an outer distance, and the outer distance is less than the opening size.

7. The electronic device assembly according to claim 6, wherein each hook post of the third hook comprises a base portion and a neck portion connected to each other, the base portions are connected to the base plate, each neck portion is connected to the hook portion of the third hook, and a cross-sectional area, perpendicular to a length direction of the hook post, of the base portion is greater than a cross-sectional area, perpendicular to the length direction of the hook post, of the neck portion.

8. The electronic device assembly according to claim 6, wherein two sides of the hook hole are provided with a hooking step, and the two hook portions of the third hook are correspondingly hooked to the hooking steps, respectively.

9. The electronic device assembly according to claim 5, wherein the front plate comprises two position holes, the two positioning holes are located on two sides of the front plate, the hook set further comprises another second hook, the two second hooks are hooked to the two positioning holes respectively; each of the two second hooks further comprises another hook element, hooking directions of the two hook portions of the hook elements of each of the second hooks are opposite.

10. The electronic device assembly according to claim 5, further comprising a locking member, wherein the base plate has a through hole, and the locking member passes through the through hole and is locked to the front plate.

11. The electronic device assembly according to claim 5, further comprising a locking member, wherein the fixing member comprises two base plates, each base plate comprises a mating portion, and each mating portion comprises a slot hole; and the locking member passes through two slot holes and is locked to the front plate.

12. An electronic device fixing mechanism, comprising:
a holder, comprising a limiting slot and a positioning hole; and
a fixing member, comprising a hook set, a base plate, and an elastic suspension arm,
wherein the elastic suspension arm is disposed on the base plate and adapted to hook to a side of the holder; the hook set comprises a first hook and a second hook; and
wherein the first hook is connected to the limiting slot to be limited in a first direction, the second hook is connected to the positioning hole to be limited in a second direction, and the first direction is different from the second direction.

13. The electronic device fixing mechanism according to claim 12, wherein
the holder comprises a rear seat and a front plate, the rear seat is connected to the front plate, and the front plate comprises the limiting slot and the positioning hole; and
the fixing member further comprises a base plate, each hook comprises a hook element, each hook element comprises a hook portion and a hook post, and each hook post is connected to the base plate and the hook portion; and the hook portion of the first hook is hooked to the limiting slot, and the hook portion of the second hook is hooked to the positioning hole.

14. The electronic device fixing mechanism according to claim 13, wherein the hook set further comprises a third hook, the front plate further comprises a hook hole, the third hook comprises two hook elements, the two hook elements of the third hook are arranged in parallel and opposite directions, the two hook elements of the third hook have a hook tip distance, the third hook is hooked to the hook hole, the hook hole has an opening size, the hook tip distance interferes with the opening size, two hook posts of the two hooks of the third hook have an outer distance, and the outer distance is less than the opening size.

15. The electronic device fixing mechanism according to claim 14, wherein each hook post of the third hook comprises a base portion and a neck portion connected to each other, the base portions are connected to the base plate, each neck portion is connected to the hook portion of the third hook, and a cross-sectional area, perpendicular to a length direction of the hook post, of the base portion is greater than a cross-sectional area, perpendicular to the length direction of the hook post, of the neck portion.

16. The electronic device fixing mechanism according to claim 14, wherein two sides of the hook hole are provided with a hooking step, and the two hook portions of the third hook are correspondingly hooked to the hooking steps, respectively.

17. The electronic device fixing mechanism according to claim 13, wherein the front plate comprises two positioning holes, the two positioning holes are located on two sides of the front plate, the hook set further comprises another second hook, the two second hooks are hooked to the two positioning holes respectively; each of the two second hooks further comprises another hook element, and hooking directions of the two hook portions of the hook elements of each of the two second hooks are opposite.

18. The electronic device fixing mechanism according to claim 13, further comprising a locking member, wherein the base plate has a through hole, and the locking member passes through the through hole and is locked to the front plate.

19. The electronic device fixing mechanism according to claim 13, further comprising a locking member, wherein the fixing member comprises two base plates, each base plate comprises a mating portion, and each mating portion comprises a slot hole; the locking member passes through two slot holes and is locked to the front plate.

20. The electronic device fixing mechanism according to claim 19, wherein the mating portion of each base plate further comprises a reinforcing portion, and one of two reinforcing portions of the two base plates is correspondingly inserted into the other of the two reinforcing portions of the two base plates.

* * * * *